(12) United States Patent
Chen et al.

(10) Patent No.: US 10,748,972 B2
(45) Date of Patent: Aug. 18, 2020

(54) ORGANIC LIGHT-EMITTING DISPLAY PANEL AND ORGANIC LIGHT-EMITTING DISPLAY DEVICE

(71) Applicant: Shanghai Tianma AM-OLED Co., Ltd., Shanghai (CN)

(72) Inventors: Xian Chen, Shanghai (CN); Lijing Han, Shanghai (CN); Yu Xin, Shanghai (CN); Yueting Fang, Shanghai (CN); Min Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 68 days.

(21) Appl. No.: 16/186,627

(22) Filed: Nov. 12, 2018

(65) Prior Publication Data

US 2020/0006448 A1    Jan. 2, 2020

(30) Foreign Application Priority Data

Jun. 29, 2018   (CN) .......................... 2018 1 0700574

(51) Int. Cl.
*H01L 27/32* (2006.01)
*G06K 9/00* (2006.01)
(Continued)

(52) U.S. Cl.
CPC ...... *H01L 27/3234* (2013.01); *G06K 9/00087* (2013.01); *G09G 3/3225* (2013.01);
(Continued)

(58) Field of Classification Search
CPC ............. H01L 27/3234; H01L 27/3246; H01L 27/3262; H01L 27/14678; H01L 51/5253; G06K 9/00087; G09G 3/3225
See application file for complete search history.

(56) References Cited

U.S. PATENT DOCUMENTS

| | | | |
|---|---|---|---|
| 2006/0044329 A1* | 3/2006 | Liedenbaum | G09G 3/30 345/695 |
| 2013/0070002 A1* | 3/2013 | Hisada | G02F 1/134309 345/690 |

(Continued)

FOREIGN PATENT DOCUMENTS

| | | |
|---|---|---|
| CN | 105702176 A | 6/2016 |
| CN | 106981503 A | 7/2017 |

OTHER PUBLICATIONS

Chinese Office Action dated Apr. 29, 2020 for corresponding CN Application No. 201810700574.8, and English translation thereof.

*Primary Examiner* — Stephen G Sherman
(74) *Attorney, Agent, or Firm* — Tarolli, Sundheim, Covell & Tummino LLP (57) ABSTRACT

The present disclosure provides an organic light-emitting display panel and a display device. The organic light-emitting display panel has display area including fingerprint recognition region and non-fingerprint recognition region; and non-display area surrounding the display area. The organic light-emitting display panel includes: a base substrate; organic light-emitting elements arranged in the display area, located on a side of the base substrate and having at least three different colors; and a fingerprint recognition unit arranged in the fingerprint recognition region. The organic light-emitting elements include first organic light-emitting element disposed in the fingerprint recognition region and second organic light-emitting element disposed in the non-fingerprint recognition region, which emit light of a same color. Each organic light-emitting element has a light-emitting region, and the light-emitting region of the first organic light-emitting element has an area S1 larger than an area S2 of the light-emitting region of the second organic light-emitting element.

17 Claims, 4 Drawing Sheets

(51) Int. Cl.
*G09G 3/3225* (2016.01)
*H01L 51/52* (2006.01)
*H01L 27/146* (2006.01)

(52) U.S. Cl.
CPC ...... *H01L 27/3246* (2013.01); *H01L 27/3262* (2013.01); *H01L 51/5253* (2013.01); H01L 27/14678 (2013.01)

(56) References Cited

U.S. PATENT DOCUMENTS

| | | | |
|---|---|---|---|
| 2014/0183480 A1* | 7/2014 | Lee | H01L 51/5265 257/40 |
| 2017/0372113 A1* | 12/2017 | Zhang | G02B 5/3025 |
| 2018/0129852 A1* | 5/2018 | Zeng | G06K 9/0004 |
| 2019/0362672 A1* | 11/2019 | Cui | H01L 27/3234 |

* cited by examiner

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims priority to Chinese Patent Application No. 201810700574.8, filed on Jun. 29, 2018, the content of which is incorporated herein by reference in its entirety.

TECHNICAL FIELD

The present disclosure relates to the field of display technologies, and in particular, to an organic light-emitting display panel and an organic light-emitting display device.

BACKGROUND

Along with the continuous development of display technologies, the under-screen fingerprint recognition technology has appeared, in which a fingerprint recognition unit is disposed in a display area of a display panel to achieve fingerprint recognition function of the display area. In an existing fingerprint recognition technology, light emitted from an organic light-emitting element is received by the fingerprint recognition unit after being reflected by a finger. Since the fingerprint recognition requires for high brightness, brightness of the organic light-emitting element in the fingerprint recognition region is improved during the fingerprint recognition. However, this would cause the lifetime of the organic light-emitting component in a fingerprint recognition region to decay faster than that of an organic light-emitting element in a non-fingerprint recognition region. In addition, the fingerprint recognition function is generally used when turning on the display device, so that frequency of use of the organic light-emitting component in the fingerprint recognition region is higher than frequency of use of the organic light-emitting element in the non-fingerprint recognition region. As a result, the lifetime of the organic light-emitting element in the fingerprint recognition region decays faster, thereby causing a problem of display uniformity.

SUMMARY

The present disclosure provides an organic light-emitting display panel and an organic light-emitting display device, which alleviates the problem of display uniformity caused by increasing brightness of the organic light-emitting element in the fingerprint recognition region during the fingerprint recognition.

In an aspect, the present disclosure provides an organic light-emitting display panel. The organic light-emitting display panel has a display area and a non-display area surrounding the display area. The display area includes a fingerprint recognition region and a non-fingerprint recognition region. The organic light-emitting display panel includes: a base substrate; a plurality of organic light-emitting elements arranged in the display area, the plurality of organic light-emitting elements being located on a side of the base substrate and having at least three different colors; and a fingerprint recognition unit arranged in the fingerprint recognition region. The plurality of organic light-emitting elements includes a first organic light-emitting element and a second organic light-emitting element, the first organic light-emitting element is disposed in the fingerprint recognition region and the second organic light-emitting elements is disposed in the non-fingerprint recognition region, and the first organic light-emitting element and the second organic light-emitting element emit light of a same color. Each of the plurality of organic light-emitting elements has a light-emitting region, and an area S1 of the light-emitting region of the first organic light-emitting element is larger than an area S2 of the light-emitting region of the second organic light-emitting element.

In another aspect, the present disclosure provides an organic light-emitting display device, including the above-mentioned organic light-emitting display panel.

BRIEF DESCRIPTION OF DRAWINGS

In order to illustrate technical solutions in embodiments of the present disclosure or in the related art, the accompanying drawings used in the embodiments and in the related art are introduced as follows. Obviously, the drawings described as follows are part of the embodiments of the present disclosure, other drawings can also be acquired by those skilled in the art without paying creative efforts.

DESCRIPTION OF EMBODIMENTS

In order to make the purpose, technical solutions, and advantages of the embodiments of the present disclosure to be clearer, the technical solutions in the embodiments of the present disclosure are clearly and completely described in the following with reference to the accompanying drawings. Obviously, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
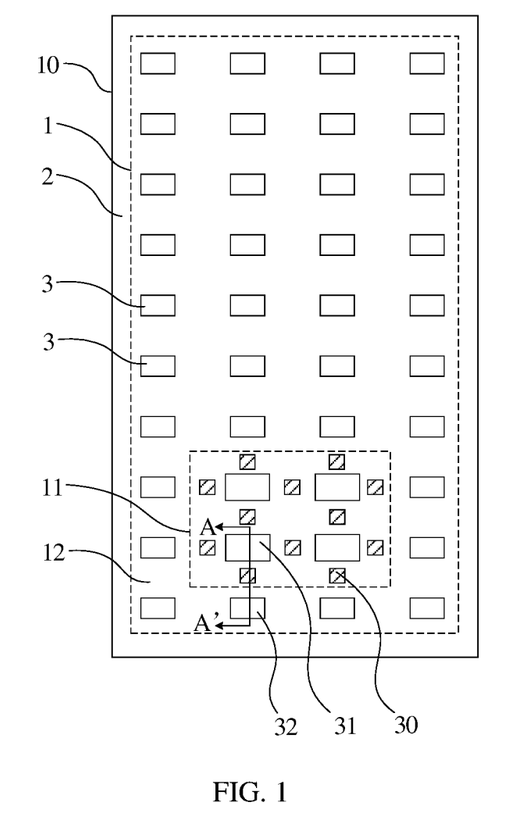
FIG. 1 is a schematic structural view of an organic light-emitting display panel according to an embodiment of the present disclosure.
Figure 2:
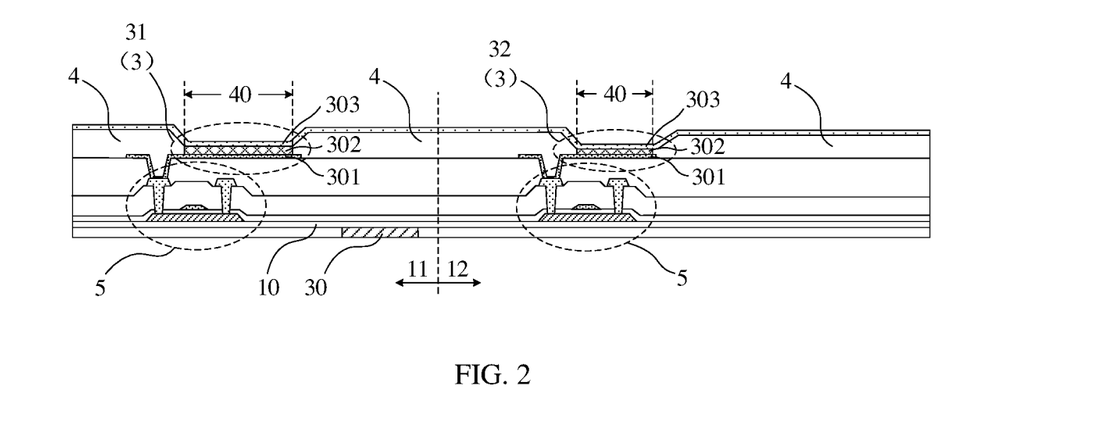
FIG. 2 is a schematic cross-sectional view along AA' direction of FIG. 1.

As shown in FIG. 1 and FIG. 2, FIG. 1 is a schematic structural view of an organic light-emitting display panel according to an embodiment of the present disclosure, and FIG. 2 is a schematic cross-sectional view along AA' direction of FIG. 1. An embodiment of the present disclosure provides an organic light-emitting display panel, including a base substrate 10. The organic light-emitting display panel is divided into a display area 1 and a non-display area 2 surrounding the display area. A plurality of organic light-emitting elements 3 is provided in the display area 1, is located at a side of the base substrate 10 and has at least three different colors. The display area 1 includes a fingerprint recognition region 11 and a non-fingerprint recognition region 12. A fingerprint recognition unit 30 is provided in the fingerprint recognition region 11. The plurality of organic light-emitting elements 3 includes a first organic light-emitting element 31 and a second organic light-emitting element 32. The first organic light-emitting element 31 is disposed in the fingerprint recognition region 11, and the second organic light-emitting element 32 is disposed in the non-fingerprint recognition region 12. The first organic light-emitting element 31 and the second organic light-emitting element 32 emit light of a same color. The organic light-emitting element 3 includes a light-emitting region. The light-emitting region of the first organic light-emitting element 31 has an area S1 larger than an area S2 of the light-emitting region of the second organic light-emitting element 32.

The area S1 of the light-emitting region of the first organic light-emitting element 31 is larger than the area S2 of the light-emitting region of the second organic light-emitting element 32. Therefore, it is more advantageous to allow, at the same brightness, the current density of the first organic light-emitting element 31 to be lower than the current density of the second organic light-emitting element 32, and when the first organic light-emitting element 31 has a larger brightness, it can effectively reduce the current density of the first organic light-emitting element 31, thereby reducing the difference between the lifetime decay of the first organic light-emitting element 31 and the lifetime decay of the second organic light-emitting element 32. The operating process of the abovementioned organic light-emitting display panel includes a non-fingerprint recognition phase and a fingerprint recognition phase. In the fingerprint recognition phase, in order to achieve the fingerprint recognition effect of the fingerprint recognition unit 30 in the fingerprint recognition region 11, the brightness of the fingerprint recognition region 11 is higher than the screen display brightness of the non-fingerprint recognition region 12. In the non-fingerprint recognition phase, the display panel performs normal display, and the screen display brightness of the fingerprint recognition region 11 is the same as the screen display brightness of the non-fingerprint recognition region 12. That is, the first organic light-emitting element 31 and the second organic light-emitting element 32 tend to have a uniform brightness, while the current density of the first organic light-emitting element 31 is lower than the current density of the second organic light-emitting element 32. In this way, in the non-fingerprint recognition phase, the lifetime decay of the first organic light-emitting element 31 is slower than the lifetime decay of the second organic light-emitting element 32, and in the fingerprint recognition phase, compared with the case in which the area of the light-emitting region of the first organic light-emitting element is smaller than or equal to the area of the light-emitting region of the second organic light-emitting element, the difference between the lifetime decay of the first organic light-emitting element 31 and the lifetime decay of the second organic light-emitting element 32 is decreased. As a result, the lifetime decay of the first organic light-emitting element 31 and the lifetime decay of the second organic light-emitting element 32 tend to be uniform as a whole, thereby alleviating the problem of display uniformity.

In an embodiment, when the abovementioned organic light-emitting display panel is operating, at a same brightness, the current density in the first organic light-emitting element 31 is lower than the current density in the second organic light-emitting element 32.

In an embodiment, the abovementioned organic light-emitting display panel includes a pixel definition layer 4. The pixel definition layer 4 includes a plurality of aperture regions 40. The organic light-emitting element 3 is located in the aperture region 40 of the pixel definition layer 4. The aperture region 40 of the pixel definition layer 4 corresponding to the first organic light-emitting element 31 is larger than the aperture region 40 of the pixel definition layer 4 corresponding to the second organic light-emitting element 32.

The aperture region 4 of the pixel definition layer 4 is used to arrange the organic light-emitting element 3, and the organic light-emitting element 3 emits light in the aperture region 40 of the pixel definition layer 4. That is, the aperture region 40 corresponds to the light-emitting region of the organic light-emitting element 3, and the two have a same shape and area.

In an embodiment, the organic light-emitting element 3 includes an anode 301, and an area of the anode 301 of the first organic light-emitting element 31 is larger than an area of the anode 301 of the second organic light-emitting element 32.

The organic light-emitting element 3 includes an anode 301, an organic light-emitting layer 302, and a cathode 303 which are sequentially stacked. Each organic light-emitting element 3 includes an individual anode 301, and different organic light-emitting elements 3 can have respective cathodes 303 arranged in an integrated layer. Under the voltage between the anode 301 and the cathode 303, electrons and holes recombine in the organic light-emitting layer 302, so that the organic light-emitting layer 302 emits light. On one hand, the anode 301 needs to cover at least the aperture region 40, and on the other hand, an area of a part of the anode 301 beyond the aperture region 40 needs to be as small as possible, so as to improve the transmittance of the part beyond the aperture region 40 while reducing the reflection of ambient light by the anode metal. Therefore, the area of the anode 301 is positively correlated with the area of the corresponding aperture region 40 of the pixel definition layer 4. The area of the aperture region 40 is relatively large, and thus the area of the corresponding anode 301 is relatively large. Then, the area of the anode 301 of the first organic light-emitting element 31 can be set to be larger than the area of the anode 301 of the second organic light-emitting element 32.

In an embodiment, the abovementioned organic light-emitting panel includes a pixel circuit (not shown). The pixel circuit is connected to the organic light-emitting element 3. The pixel circuit includes a driving transistor 5. A channel region of the driving transistor 5 of the pixel circuit corresponding to the first organic light-emitting element 31 has a width-to-length ratio smaller than that of a channel region of the driving transistor 5 of the pixel circuit corresponding to the second organic light-emitting element 32.

The driving transistor 5 of the pixel circuit is used to generate a driving current, and the driving current drives the organic light-emitting element 3 to emit light. The width-to-length ratio of a channel region of a driving transistor 5 is positively correlated with a size of the driving transistor 5. The larger the size of the driving transistor 5 is, the larger a space of a non-aperture region beyond the aperture region 40 needs to be occupied, and the lower the transmittance of the area beyond the aperture region 40 is. Therefore, the width-to-length ratio of the channel region of the driving transistor 5 corresponding to the first organic light-emitting element 31 located in the fingerprint recognition region 11 can be set to be small, so that the transmittance of the fingerprint recognition region 11 can be increased and further the fingerprint recognition effect can be improved.

Figure 3:
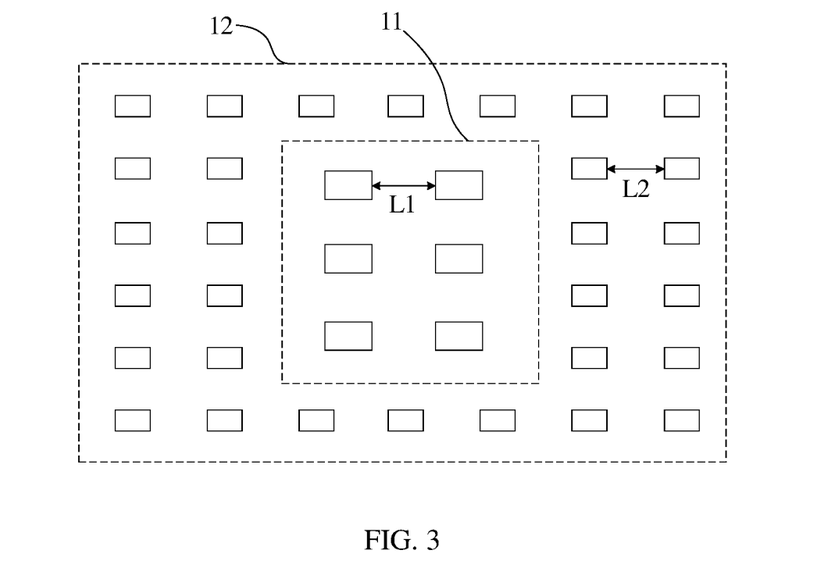
FIG. 3 is a partial schematic view of another organic light-emitting display panel according to an embodiment of the present disclosure.

In an embodiment, as shown in FIG. 3, which is a partial schematic view of another organic light-emitting display panel according to an embodiment of the present disclosure, a width L1 of a gap between light-emitting regions of two adjacent organic light-emitting elements 3 in the fingerprint recognition region 11 is equal to or larger than a width L2 of a gap between light-emitting regions of two adjacent organic light-emitting elements 3 in the non-fingerprint recognition region 12.

The width L1 of the gap between the light-emitting regions of the organic light-emitting elements 3 in the fingerprint recognition region 11 is equal to or larger than the width L2 of the gap between the light-emitting regions of two adjacent organic light-emitting elements 3 in the non-fingerprint recognition region 12. This can avoid the too small gap between the light-emitting regions in the fingerprint recognition region 11, thereby improving the transmittance and further improving the fingerprint recognition effect in the fingerprint recognition region 11.

In an embodiment, the area S1 of the light-emitting region of the first organic light-emitting element 31 and the area S2 of the light-emitting region of the second organic light-emitting element 32 satisfy: $10\% \leq (S1-S2)/S2 \leq 40\%$.

On the one hand, it is considered that the area S1 of the light-emitting region of the first organic light-emitting element 31 is increased, so as to reduce the current density of the first organic light-emitting element 31 when the brightness of the first organic light-emitting element 31 is the same as the brightness of the second organic light-emitting element 32. In addition, the difference between the current density of the first organic light-emitting element 31 and the current density of the second organic light-emitting element 32 is reduced when the brightness of the first organic light-emitting element 31 is large, so that the lifetime decay of the first organic light-emitting element 31 and the lifetime decay of the second organic light-emitting element 32 tend to be uniform. On the other hand, the area S1 of the light-emitting region is increased, so that in the case in which the pixel area is constant, it inevitably results in that an area of a light-transmitting area beyond the light-emitting region is reduced, which would adversely affect the fingerprint recognition in the fingerprint recognition region 11. Therefore, the area S1 of the light-emitting region cannot be excessively large. In consideration of the above two aspects, the area S1 of the light-emitting region of the first organic light-emitting element 31 and the area S2 of the light-emitting region of the second organic light-emitting element 32 satisfy: $10\% \leq (S1-S2)/S2 \leq 40\%$.

In an embodiment, in the fingerprint recognition region 11, the light-emitting regions of the organic light-emitting elements 3 emitting a same color light have a same area, and in the non-fingerprint recognition region 12, the light-emitting regions of the organic light-emitting elements 3 emitting a same color light have a same area.

For example, the organic light-emitting elements 3 include an organic light-emitting element 3 emitting red light, an organic light-emitting element 3 emitting blue light, and an organic light-emitting element 3 emitting green light. In order to achieve color consistency of the overall display image, in the fingerprint recognition region 11, the light-emitting regions of all the organic light-emitting elements 3 emitting red light have a same area, the light-emitting regions of all the organic light-emitting elements 3 emitting blue light have a same area, and the light-emitting regions of all the organic light-emitting elements 3 emitting green light have a same area. Similarly, in the non-fingerprint recognition region 12, the light-emitting regions of all the organic light-emitting elements 3 emitting red light have a same area, the light-emitting regions of all the organic light-emitting elements 3 emitting blue light have a same area, and the light-emitting regions of all the organic light-emitting elements 3 emitting green light have a same area.

Figure 4:
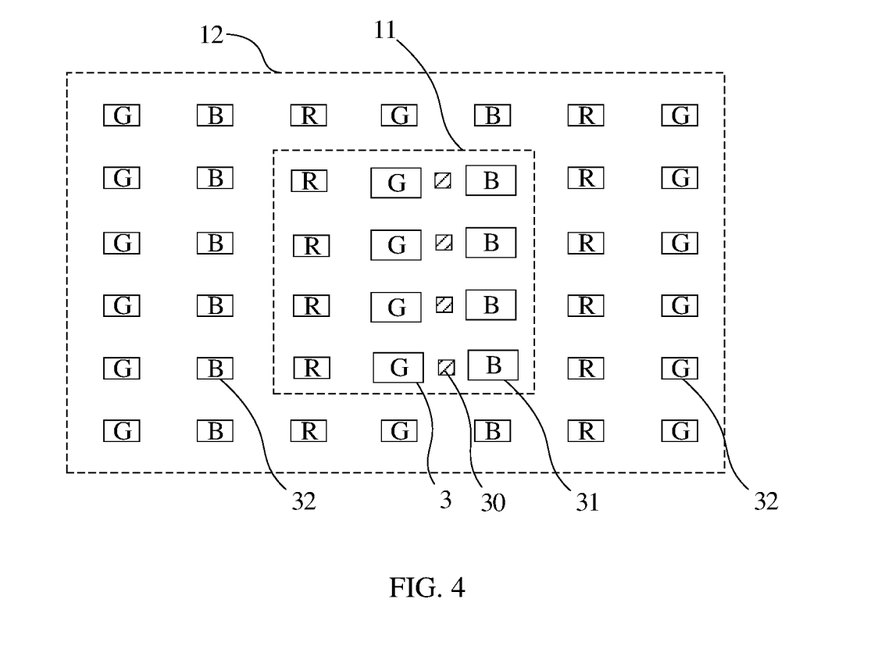
FIG. 4 is a partial schematic view of still another organic light-emitting display panel according to an embodiment of the present disclosure.

In an embodiment, as shown in FIG. 4, which is a partial schematic view of still another organic light-emitting display panel according to an embodiment of the present disclosure, the organic light-emitting elements 3 include a blue organic light-emitting element B, a green organic light-emitting element G, and a red organic light-emitting element R. The first organic light-emitting element 31 and the second organic light-emitting element 32 are one of the blue organic light-emitting element B, the green organic light-emitting element G, or the red organic light-emitting element R.

In an embodiment, the first organic light-emitting element 31 and the second organic light-emitting element 32 are the blue organic light-emitting element B or the green organic light-emitting element G. The area of the light-emitting region of the red organic light-emitting element R located in the fingerprint recognition region 11 is equal to the area of the light-emitting region of the red organic light-emitting element R located in the non-fingerprint recognition region 12.

For example, the area of the light-emitting region of the red organic light-emitting element R in the fingerprint recognition region 11 is equal to the area of the light-emitting region of the red organic light-emitting element R in the non-fingerprint recognition region 12, the area of the light-emitting region of the blue organic light-emitting element B in the fingerprint recognition region 11 is larger than the area of the light-emitting region of the blue organic light-emitting element B in the non-fingerprint recognition region 12, and the area of the light-emitting region of the green organic light-emitting element G in the fingerprint recognition region 11 is larger than the area of the light-emitting region of the green organic light-emitting element in the non-fingerprint recognition region 12. Since the fingerprint recognition unit 30 is insensitive to red light but sensitive to blue or green light, it can be configured that the area of the light-emitting region of the red organic light-emitting element R in the fingerprint recognition region 11 is constant, and the area of the light-emitting region of the blue organic light-emitting element B in the fingerprint recognition region 11 and the area of the light-emitting region of the green organic light-emitting element G in the fingerprint recognition region 11 are increased. In the fingerprint recognition phase, the brightness of the red organic light-emitting element R in the fingerprint recognition region 11 does not change, and only the brightness of the blue organic light-emitting element B and the brightness of the green organic light-emitting element G in the fingerprint recognition region 11 are increased. In this way, the use of the light emitted by the organic light-emitting element 3 can be maximized for fingerprint recognition.

In an embodiment, the fingerprint recognition unit 30 is disposed at least between adjacent blue organic light-emitting element B and green organic light-emitting element G.

Since the fingerprint recognition unit 30 is more sensitive to blue light and green light, setting the fingerprint recognition unit 30 between adjacent blue organic light-emitting element B and green organic light-emitting element G can maximize the use of light for fingerprint recognition.

Figure 5:
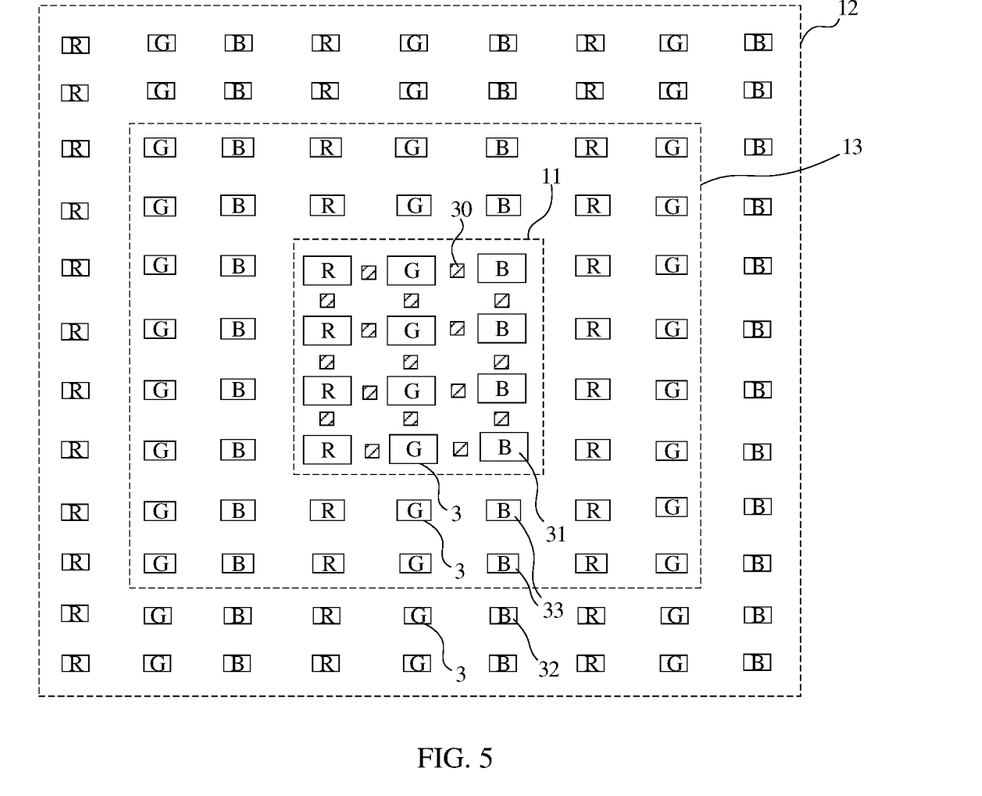
FIG. 5 is a partial schematic view of yet another organic light-emitting display panel according to an embodiment of the present disclosure.

In an embodiment, as shown FIG. 5, which is a partial schematic view of still another organic light-emitting display panel according to an embodiment of the present disclosure, a transition region 13 is disposed between the fingerprint recognition region 11 and the non-fingerprint recognition region 12, and a third organic light-emitting element 33 is provided in the transition region 13. The third organic light-emitting element 33, the first organic light-emitting element 31 and the second organic light-emitting element 32 can emit light of a same color. An area of the light-emitting region of the third organic light-emitting element 33 is smaller than the area of the light-emitting region of the first organic light-emitting element 31 and larger than the area of the light-emitting region of the second organic light-emitting element 32.

In the transition region 13, the area of the light-emitting region of the third organic light-emitting element 33 is between the area of the light-emitting region of the first organic light-emitting element 31 and the area of the light-emitting region of the second organic light-emitting element 32, so as to avoid a too abrupt change from the area of the light-emitting region of the organic light-emitting element in the fingerprint recognition region 11 to the area of the light-emitting region of the organic light-emitting element in the non-fingerprint recognition region 12. The transition region 13 serves as a buffer to dilute the abrupt boundary between the fingerprint recognition region 11 and the non-fingerprint recognition region 12.

In an embodiment, in the transition region 13, for the organic light-emitting elements 3 emitting light of a same color, the area of the light-emitting region of the organic light-emitting element 3 close to the fingerprint recognition region 11 is larger than the area of the light-emitting region of the organic light-emitting element 3 far from the fingerprint recognition region 11.

In the transition region 13, it is further configured that the area of the light-emitting region of the organic light-emitting element 3 close to the fingerprint recognition region 11 is relatively large while the area of the light-emitting region of the organic light-emitting element 3 far from the fingerprint recognition region 11 is relatively small, thereby further diluting the abrupt boundary between the fingerprint recognition region 11 and the non-fingerprint recognition region 12

In an embodiment, the fingerprint recognition unit 30 is disposed in a region between the organic light-emitting elements 3 in the fingerprint recognition region 11. The region between the organic light-emitting elements 3 is a region for transmitting light, and thus is more conductive to fingerprint recognition.

In an embodiment, as shown in FIG. 2, the fingerprint recognition unit 30 is an outboard fingerprint recognition unit, and the fingerprint recognition unit 30 is located on a side of the base substrate 10 facing away from the organic light-emitting element 3.

Figure 6:
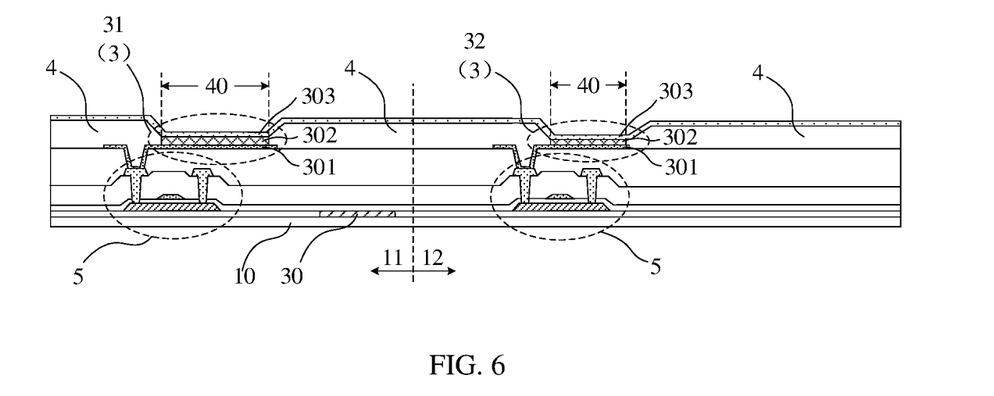
FIG. 6 is another schematic cross-sectional view along AA' direction of FIG. 1.

In an embodiment, as shown in FIG. 6, which is another schematic cross-sectional view along AA' direction of FIG. 1, the fingerprint recognition unit 30 is a built-in fingerprint recognition unit, and the fingerprint recognition unit 30 is located on a side of the base substrate 10 facing toward the organic light-emitting element 3.

Figure 7:
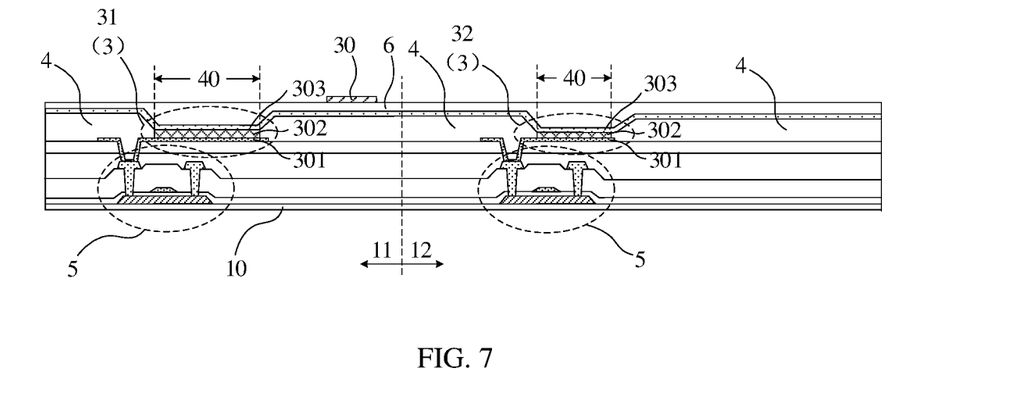
FIG. 7 is still another schematic cross-sectional view along AA' direction of FIG. 1.

In an embodiment, as shown in FIG. 7, which is still another schematic cross-sectional view along AA' direction of FIG. 1, the organic light-emitting display panel further includes an encapsulation layer 6. The organic light-emitting element 3 is located between the base substrate 10 and the encapsulation layer 6, and the fingerprint recognition unit 30 is located on a side of the encapsulation layer 6 facing away from the organic light-emitting element 3. The encapsulation layer 6 is used to insulate the organic light-emitting element 3 from water and oxygen and thus protect the organic light-emitting element 3.

It should be noted that, in the embodiments of the present disclosure, the arrangement of the organic light-emitting elements and the shape of the light-emitting region are not limited herein, and the arrangement of the organic light-emitting elements 3 and the shape of the light-emitting region as illustrated are merely exemplary.

Figure 8:
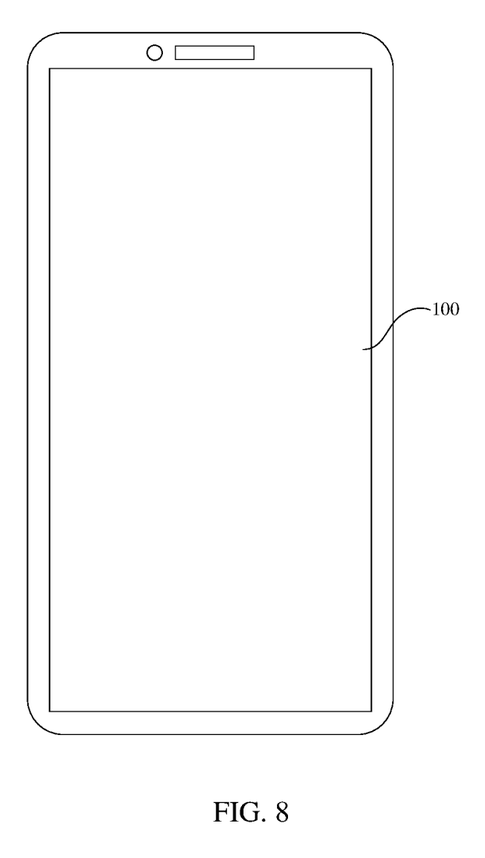
FIG. 8 is a schematic structural view of an organic light-emitting display device according to an embodiment of the present disclosure.

As shown in FIG. 8, FIG. 8 is a schematic structural view of an organic light-emitting display device according to an embodiment of the present disclosure. The present disclosure further provides an organic light-emitting display device, including the abovementioned organic light-emitting display panel 100.

The specific structure and principle of the organic light-emitting display panel 100 are the same as those of the above embodiments, and details thereof will not be further described herein. The display device can be any electronic device having a display function, such as a touch display screen, a cellphone, a tablet computer, a notebook computer, an electronic paper book, a television, etc.

In this embodiment of the present disclosure, the area of the light-emitting region of the first organic light-emitting element in the fingerprint recognition region is larger than the area of the light-emitting region of the second organic light-emitting element in the non-fingerprint recognition region. Compared with the case in which the area of the light-emitting region of the first organic light-emitting element is smaller than or equal to the area of the light-emitting region of the second organic light-emitting element, in the fingerprint recognition phase, even if the brightness of the light-emitting element in the fingerprint recognition region is improved, the current density of the first light-emitting element can be effectively reduced; and in the non-fingerprint recognition phase, it is advantageous to allow, at a same brightness, the current density of the first organic light-emitting element to be lower than the current density of the second organic light-emitting element. As a result, the lifetime decay of the first organic light-emitting element 31 and the lifetime decay of the second organic light-emitting element 32 can tend to be uniform as a whole, thereby alleviating the problem of display uniformity.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. An organic light-emitting display panel, comprising a display area and a non-display area surrounding the display area, and the display area comprises a fingerprint recognition region and a non-fingerprint recognition region, the organic light-emitting display panel comprising:
   a base substrate;
   a plurality of organic light-emitting elements arranged in the display area, the plurality of organic light-emitting elements being located on a side of the base substrate;
   a fingerprint recognition unit arranged in the fingerprint recognition region; and
   a pixel definition layer, the pixel definition layer having a plurality of aperture regions, and each of the plurality of organic light-emitting elements being located in one of the plurality of aperture regions of the pixel definition layer,
   wherein the plurality of organic light-emitting elements comprises a first organic light-emitting element and a second organic light-emitting element, the first organic light-emitting element is disposed in the fingerprint recognition region and the second organic light-emitting elements is disposed in the non-fingerprint recognition region, and the first organic light-emitting element and the second organic light-emitting element emit light of a same color of at least three different colors, and
   wherein an area S1 of an aperture region of the plurality of aperture regions of the pixel definition layer corresponding to the first organic light-emitting element is larger than an area S2 of an aperture region of the plurality of aperture regions of the pixel definition layer corresponding to the second organic light-emitting element.

2. The organic light-emitting display panel according to claim 1, wherein when operating, a current density of the first organic light-emitting element is lower than a current density of the second organic light-emitting element, at a same brightness.

3. The organic light-emitting display panel according to claim 1, wherein each of the plurality of organic light-emitting elements comprises an anode, and an area of the anode of the first organic light-emitting element is larger than an area of the anode of the second organic light-emitting element.

4. The organic light-emitting display panel according to claim 1, further comprising a plurality of pixel circuits, each of the plurality of pixel circuits is connected to one of the plurality of organic light-emitting elements, each of the plurality of pixel circuits comprises a driving transistor, and a width-to-length ratio of a channel region of the driving transistor of one of the plurality of pixel circuits corresponding to the first organic light-emitting element is smaller than a width-to-length ratio of a channel region of the driving transistor of one of the plurality of pixel circuits corresponding to the second organic light-emitting element.

5. The organic light-emitting display panel according to claim 1, wherein a width of a gap between aperture regions corresponding to two adjacent organic light-emitting elements of the plurality of organic light-emitting elements in the fingerprint recognition region is greater than or equal to a width of a gap between aperture regions corresponding to another two adjacent organic light-emitting elements of the plurality of organic light-emitting elements in the non-fingerprint recognition region.

6. The organic light-emitting display panel according to claim 1, wherein $0.1 \leq (S1-S2)/S2 < 0.4$.

7. The organic light-emitting display panel according to claim 1, wherein in the fingerprint recognition region, aperture regions corresponding to at least two of the plurality of organic light-emitting elements emitting a same color light have a same area, and in the non-fingerprint recognition region, aperture regions corresponding to at least two of the plurality of organic light-emitting elements emitting a same color light have a same area.

8. The organic light-emitting display panel according to claim 1, wherein the plurality of organic light-emitting elements comprises at least one blue organic light-emitting element, at least one green organic light-emitting element, and at least one red organic light-emitting element, and
   wherein the first organic light-emitting element and the second organic light-emitting element are one of the blue organic light-emitting element, the green organic light-emitting element, or the red organic light-emitting element.

9. The organic light-emitting display panel according to claim 8, wherein the first organic light-emitting element and the second organic light-emitting element are the blue organic light-emitting element or the green organic light-emitting element, and
   an area of the aperture region corresponding to the red organic light-emitting element located in the fingerprint recognition region is equal to an area of the aperture region corresponding to the red organic light-emitting element located in the non-fingerprint recognition region.

10. The organic light-emitting display panel according to claim 9, wherein the fingerprint recognition unit is disposed at least between one blue organic light-emitting element and one green organic light-emitting element of the plurality of organic light-emitting elements which are adjacent.

11. The organic light-emitting display panel according to claim 1, wherein a transition region is disposed between the fingerprint recognition region and the non-fingerprint recognition region, and a third organic light-emitting element of the plurality of organic light-emitting elements is provided in the transition region,
   wherein the third organic light-emitting element, the first organic light-emitting element and the second organic light-emitting element emit light of a same color, and
   wherein an area of the aperture region corresponding to the third organic light-emitting element is less than the area of the aperture region corresponding to the first organic light-emitting element and greater than the area of the aperture region corresponding to the second organic light-emitting element.

12. The organic light-emitting display panel according to claim 11, wherein in the transition region, among at least two of the plurality of organic light-emitting elements emitting light of a same color, an area of an aperture region corresponding to one of the plurality of organic light-emitting elements close to the fingerprint recognition region is greater than an area of an aperture region corresponding to another one of the plurality of organic light-emitting elements far away from the fingerprint recognition region.

13. The organic light-emitting display panel according to claim 1, wherein the fingerprint recognition unit is disposed in a region between two organic light-emitting elements of the plurality of organic light-emitting elements in the fingerprint recognition region.

14. The organic light-emitting display panel according to claim 1, wherein the fingerprint recognition unit is an outboard fingerprint recognition unit, and the fingerprint recognition unit is located at a side of the base substrate facing away from the plurality of organic light-emitting elements.

15. The organic light-emitting display panel according to claim 1, wherein the fingerprint recognition unit is a built-in fingerprint recognition unit, and the fingerprint recognition unit is located at a side of the base substrate facing toward the plurality of organic light-emitting elements.

16. The organic light-emitting display panel according to claim 1, further comprising an encapsulation layer, the plurality of organic light-emitting elements is located between the base substrate and the encapsulation layer, and the fingerprint recognition unit is located at a side of the encapsulation layer facing away from the plurality of organic light-emitting elements.

17. An organic light-emitting display device, comprising an organic light-emitting display panel, wherein the organic light-emitting display panel has a display area and a non-display area surrounding the display area, and the display area comprises a fingerprint recognition region and a non-fingerprint recognition region, the organic light-emitting display panel comprising:
  a base substrate;
  a plurality of organic light-emitting elements arranged in the display area, the plurality of organic light-emitting elements being located on a side of the base substrate;
  a fingerprint recognition unit arranged in the fingerprint recognition region; and
  a pixel definition layer, the pixel definition layer having a plurality of aperture regions, and each of the plurality of organic light-emitting elements being located in one of the plurality of aperture regions of the pixel definition layer,
wherein the plurality of organic light-emitting elements comprises a first organic light-emitting element and a second organic light-emitting element, the first organic light-emitting element is disposed in the fingerprint recognition region and the second organic light-emitting elements is disposed in the non-fingerprint recognition region, and the first organic light-emitting element and the second organic light-emitting element emit light of a same color of at least three different colors, and
wherein an area S1 of an aperture region of the plurality of aperture regions of the pixel definition layer corresponding to the first organic light-emitting element is larger than an area S2 of an aperture region of the plurality of aperture regions of the pixel definition layer corresponding to the second organic light-emitting element.

* * * * *